(12) United States Patent
Sung (10) Patent No.: US 7,102,436 B2
(45) Date of Patent: Sep. 5, 2006

(54) APPARATUS AND METHOD FOR INCREASING A SLEW RATE OF AN OPERATIONAL AMPLIFIER

(75) Inventor: Kuang-Feng Sung, Taichung County (TW)

(73) Assignee: Novatek Microelectronics Corp., Hsinchu (TW)

( * ) Notice: Subject to any disclaimer, the term of this patent is extended or adjusted under 35 U.S.C. 154(b) by 51 days.

(21) Appl. No.: 10/905,402

(22) Filed: Dec. 31, 2004

(65) Prior Publication Data

US 2005/0179495 A1    Aug. 18, 2005

(30) Foreign Application Priority Data

Feb. 17, 2004    (TW) ............................... 93103710 A (51) Int. Cl.
*H03F 3/45*    (2006.01)
(52) U.S. Cl. ...................... 330/255; 330/260
(58) Field of Classification Search ................ 330/253, 330/255, 260
See application file for complete search history.

(56) References Cited

U.S. PATENT DOCUMENTS

| | | | | |
|---|---|---|---|---|
| 4,857,863 A | * | 8/1989 | Ganger et al. .............. 330/264 |
| 6,147,665 A | * | 11/2000 | Friedman ................... 345/75.2 |
| 6,600,483 B1 | * | 7/2003 | Akita et al. ................. 345/204 |
| 6,614,295 B1 | * | 9/2003 | Tsuchi ........................ 327/563 |
| 6,734,720 B1 | * | 5/2004 | Imai et al. .................. 327/560 |

* cited by examiner

*Primary Examiner*—Patricia Nguyen
(74) *Attorney, Agent, or Firm*—Jianq Chyun IP Office (57) ABSTRACT

An apparatus and method for increasing a slew rate of an operational amplifier are provided. It only requires an operational amplifier, a monitoring control device, a push-pull output device, and a second input current source pair. It uses a monitoring control device controlled by the output stage to control the supplementary device and the second input current source pair in order to increase a slew rate of an operational amplifier. This operational amplifier also provides the rail-to-rail output function. In addition, because it does not require additional circuit to increase the slew rate, the chip size is smaller. With respect to the circuit structure, it is very simple and can be applied to the pre-existing operational amplifier without re-designing the operational amplifier and thus can keep the original characteristics of the operational amplifier.

33 Claims, 7 Drawing Sheets

APPARATUS AND METHOD FOR INCREASING A SLEW RATE OF AN OPERATIONAL AMPLIFIER

CROSS-REFERENCE TO RELATED APPLICATION

This application claims the priority benefit of Taiwan application Serial No. 93103710 on Feb. 17, 2004.

BACKGROUND OF THE INVENTION

1. Field of the Invention

This invention generally relates to an apparatus and method for increasing a slew rate of an operational amplifier, and more particularly to an apparatus and method for increasing a slew rate of an operational amplifier by using a monitoring control device controlled by the output stage to control the supplementary output device and the supplementary input device in order to increase a slew rate of an operational amplifier.

2. Description of Related Art

To acquire a higher slew rate of the operational amplifier (OPAMP), the conventional methods include increasing the current of the differential input pair or reducing the compensation capacitance. However, the former will increase the quiescent/operating current consumption; the latter will sacrifice the stability of the OPAMP. Another conventional art is to use the error amplifier to push the common source output stage, i.e., the push-pull output stage. I.e., it requires additional circuit to achieve the target. Although those conventional methods can increase the slew rate, they also have some drawbacks such as increase of the chip size, increase of the current, and sacrifice of the stability.

Figure 1:
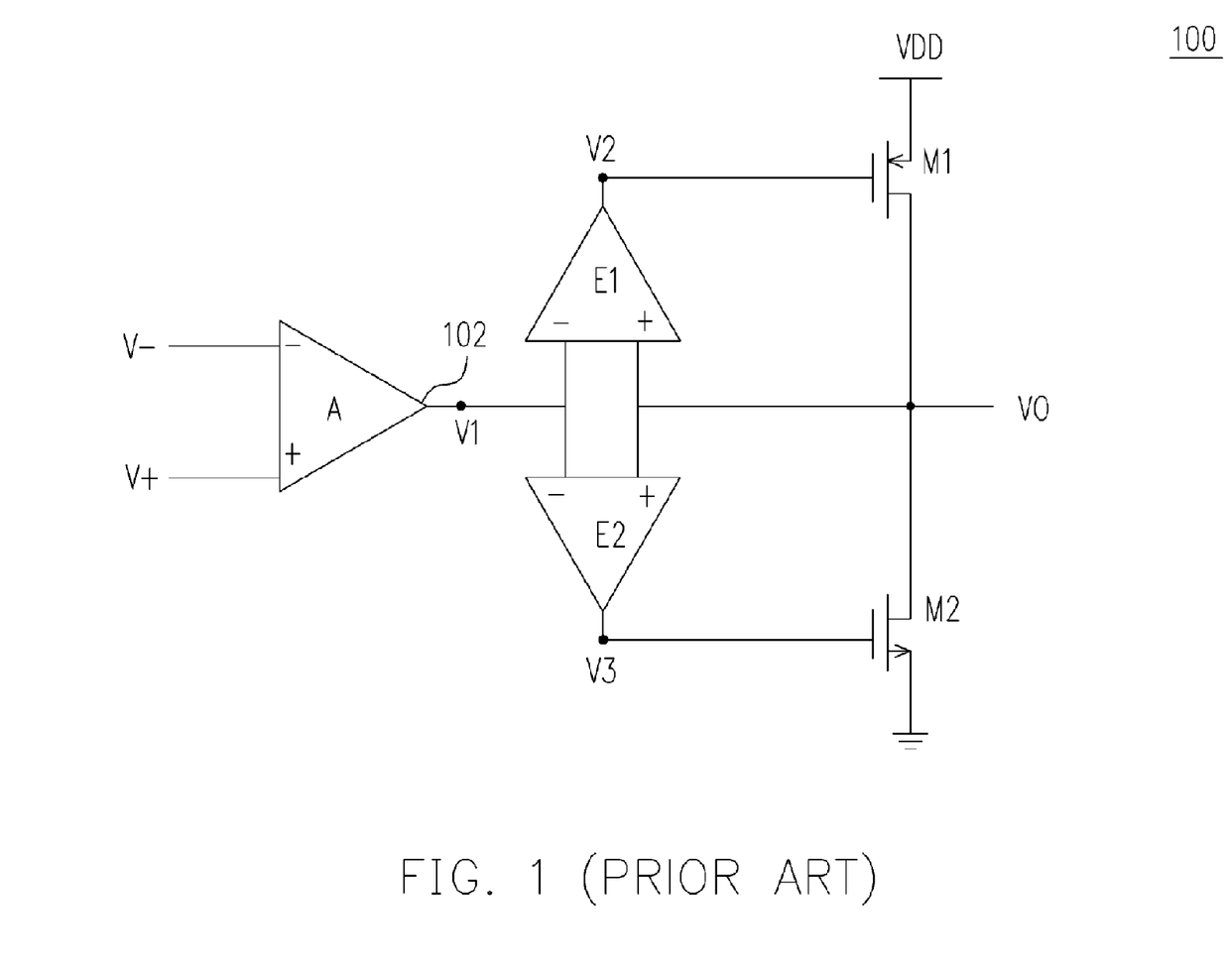
FIG. 1 shows a conventional OPAMP 100 with a high slew rate.

Referring to FIG. 1, FIG. 1 shows a conventional OPAMP 100 with a high slew rate. It includes an OPAMP A, two error amplifiers E1 and E2, and a push-pull output stage consisting of two MOSFETs M1 and M2. The error amplifiers E1 and E2 control these two MOSFETs M1 and M2 by connecting the inverting input terminal of the error amplifier to the output terminal 102 of OPAMP A, connecting the non-inverting input terminal of the error amplifier to the virtual short consisting of the node VO, and using a negative feedback loop consisting the error amplifier E1 and MOSFET M1, and the error amplifier E2 and MOSFET M2 to control the push-pull output stage consisting of MOSFETs M1 and M2, so as to provide the loading with the current for pushing or pulling.

The error amplifiers E1 and E2 can monitors whether the signals in the inverting input terminal and in the non-inverting input terminal are the same. If not, the MOSFET M1 or M2 will be turned on so that the push-pull output stage becomes a current source (i.e., push the current to the output terminal) or a current sink (i.e., pull the current to the output terminal or to the loading).

The operation principle of the OPAMP 100 is when the output voltage VO is lower than the output voltage V1 of the OPAMP A, the output voltage V2 of the error amplifier E1 will turn on the MOSFET M1 and the output voltage V3 of the error amplifier E2 will turn off the MOSFET M2; at the time the MOSFET M1 will push the current to the output terminal. When the output voltage VO is higher than the output voltage V1 of the OPAMP A, the output voltage V2 of the error amplifier E1 will turn off the MOSFET M1 and the output voltage V3 of the error amplifier E2 will turn on the MOSFET M2; at the time the MOSFET M2 will pull the current to the output terminal. When the output voltage VO is equal to the output voltage V1 of the OPAMP A, the output voltage V2 of the error amplifier E1 will make the MOSFET M1 operate under a static current and the output voltage V3 of the error amplifier E2 will make the MOSFET M2 operate under a static current; at the time the output voltage VO is equal to the output voltage V1 of the OMAMP A. I.e., when the input is equal to the output, the MOSFETs M1 and M2 will operate under the pre-set DC Bias condition.

The above structure generally is for heavy loading, e.g., small resistor and large capacitor. To make the MOSFETs M1 and M2 provide the loading with a high current, the aspect ratio of the MOSFETs M1 and M2 must be very large. Hence, the push-pull output stage requires a huge static current consumption. I.e., it is very difficult to achieve low power consumption and a high slew rate at the same time. Further, the circuit looks very simple, but practically is very complicated. If the error amplifiers E1 and E2 are a single stage amplifier, each at least requires 5 MOSFETs. Hence, the error amplifiers E1 and E2 totally at least require 10 MOSFETs.

In addition, to compensate the pole-zero, it requires 2 compensation capacitors if the Miller compensation is used. It also has to consider the offset voltage, the layout symmetry, bandwidth, and noise of the error amplifiers. Hence, those considerations inevitably increase the size of the chip and the production cost. Further, it also has to consider the influence of the cross distortion and the offset voltage VOS of the error amplifier to the linearity of the OPAMP. The above limitations make the above structure more complicated and occupy a huge size. Hence, although the conventional OPAMP 100 can provide an excellent driving ability and a simple structure, it occupies a huge size and increases the production cost. In addition, the issue of cross distortion, the problems generated from the characteristics of the error amplifier, and the issue of the high power consumption have to be considered.

SUMMARY OF THE INVENTION

An object of the present invention is to provide an apparatus and method for increasing the slew rate of an operational amplifier Another object of the present invention is to provide an apparatus and method for increasing the slew rate of an operational amplifier, especially for driving a heavy loading Still another object of the present invention is to provide an apparatus and method for increasing a slew rate of an operational amplifier without increasing the static current consumption.

Still another object of the present invention is to provide an apparatus and method for increasing a slew rate of an operational amplifier without changing the pole-zero of the operational amplifier. The apparatus and method for increasing a slew rate of an operational amplifier of the present invention use a monitoring control device controlled by the output stage to control the supplementary output device and the supplementary input device in order to increase a slew rate of an operational amplifier. Hence, the apparatus and method for increasing a slew rate of an operational amplifier of the present invention have the advantages of low quiescent/operating current, high slew rate, small chip size, and compact structure.

The apparatus and method for increasing the slew rate of an operational amplifier of the present invention do not monitor the input and output terminals, but uses the supplementary output device (i.e. an additional output stage) with a high driving ability in addition to the original output stage.

This additional output stage is controlled by the control signal of the original output stage. When the output catches up with the input, the additional output stage will be turned off automatically. Otherwise, it will provide a high current to the output terminal. Likewise, a current source controlled by the control signal of the original output stage will be provided to the input pair. When the output catches up with the input, the current source will be turned off automatically.

The present invention provides an apparatus for increasing the slew rate of an operational amplifier, comprising: an operational amplifier having an input stage and an output stage, the input stage receiving an input signal and amplifying the input signal, the output stage outputting an output signal, the output signal being the amplified input signal; a supplementary output device coupled to the output stage of the operational amplifier, the supplementary output device being controlled by the output stage; and a supplementary input device coupled to the input stage of the operational amplifier, the supplementary input device being controlled by the output stage; wherein when a voltage level of the output signal is not substantially equal to a voltage level of the input signal, the output stage controls the supplementary output device to provide the output stage with a supplementary output current and controls the supplementary input device to provide the input stage with a supplementary input current.

In a preferred embodiment of the present invention, when the voltage level of the output signal is substantially equal to the voltage level of the input signal, the supplementary input device and the supplementary output device is off and do not provide the supplementary input current and the supplementary output current.

In a preferred embodiment of the present invention, the input stage of the operational amplifier includes: a first input circuit and a second input circuit, the first input circuit and the second input circuit being respectively coupled to a control electrode of a non-inverting input terminal and an inverting input terminal of the operational amplifier; a first current source circuit coupled to the second input circuit and pushed by the second input circuit; a second current source circuit coupled to the first input circuit and pushed by the first input circuit, the first current source circuit and the second current source circuit being serial-connected between a first voltage supply terminal and a second voltage supply terminal; a first input pair constant current circuit coupled to the first input circuit; and a second input pair constant current circuit coupled to the first input circuit.

In a preferred embodiment of the present invention, the input stage of the operational amplifier includes: a first input circuit, the first input circuit being coupled to a control electrode of a non-inverting input terminal and an inverting input terminal of the operational amplifier; a second current source circuit coupled to the first input circuit and pushed by the first input circuit; and a first current source circuit, the first current source circuit and the second current source circuit being serial-connected between a first voltage supply terminal and a second voltage supply terminal, the first input circuit being serial-connected to a first input pair constant current circuit.

In a preferred embodiment of the present invention, the input stage of the operational amplifier further includes a second input circuit, the second input circuit being coupled to a control electrode of a non-inverting input terminal and an inverting input terminal of the operational amplifier; a first current source circuit coupled to the second input circuit and pushed by the second input circuit; and a second current source circuit, the first current source circuit and the second current source circuit are serial-connected between a first voltage supply terminal and a second voltage supply terminal, the second input circuit being serial-connected to a second input pair constant current circuit.

In a preferred embodiment of the present invention, the output stage of the operational amplifier is a push-pull output stage serial-connected to between the first voltage supply terminal and the second voltage supply terminal, the push-pull output stage including a first output transistor and a second output transistor, the first transistor being pushed by the first current source circuit, the second transistor being pushed by the second current source circuit.

In a preferred embodiment of the present invention, a monitoring control device is between the supplementary output device and the output stage of the operational amplifier, the monitoring control device being controlled by the output stage to generate a pull-up control signal and pull-down control signal to the supplementary output device to control the supplementary output device.

In a preferred embodiment of the present invention, the monitoring control device includes: a pull-up attenuation unit having an input terminal couple to a control gate of the first output transistor to generate the pull-up control signal; and a pull-down attenuation unit having an input terminal couple to a control gate of the second output transistor to generate the pull-down control signal.

In a preferred embodiment of the present invention, the pull-up attenuation unit is a conducting transistor and the pull-down attenuation unit is another conducting transistor.

In a preferred embodiment of the present invention, the pull-up attenuation unit includes a first transistor and a first constant current source serial-connected together, a gate of the first transistor being coupled to the control gate of the first output transistor of the output stage; the pull-up attenuation unit includes a second transistor and a second constant current source serial-connected together, a gate of the second transistor being coupled to the control gate of the second output transistor of the output stage.

In a preferred embodiment of the present invention, the supplementary output device includes: a pull-up output unit receiving the pull-up control signal, an output terminal of the pull-up output unit being coupled to the output terminal of the operational amplifier; and a pull-down output unit receiving the pull-down control signal, an output terminal of the pull-down output unit being coupled to the output terminal of the operational amplifier.

In a preferred embodiment of the present invention, the supplementary input device includes a first sub-current source to receive the pull-up control signal, and an output terminal of the supplementary input device is parallel-connected to the first input pair constant current circuit and is serial-connected to the first input circuit.

In a preferred embodiment of the present invention, the first sub-current source includes a first sub-current source control transistor, a gate of the first sub-current source control transistor being coupled to the pull-up control signal, a source of the first sub-current source control transistor being coupled to a first voltage supply terminal, a drain of the first sub-current source control transistor being coupled to the first input circuit.

In a preferred embodiment of the present invention, the first sub-current source includes a first sub-current source control transistor and a first sub-constant current source, a gate of the first sub-current source control transistor being coupled to the pull-up control signal, a source of the first sub-current source control transistor being coupled to the first sub-constant current source, a drain of the first sub-current source control transistor being coupled to the first input circuit.

In a preferred embodiment of the present invention, the first sub-current source includes a current mirror unit, the current mirror unit including a first current mirror and a first current mirror control transistor, a gate of the first current mirror control transistor being coupled to the pull-up control signal, a drain of the first current mirror control transistor being coupled to the first current mirror, a source of the first current mirror control transistor being coupled to a first voltage supply terminal via a first sub-constant current source or being coupled to a first voltage supply terminal directly, the first current mirror being parallel-connected to the second input pair constant current source and serial-connected to the second input circuit.

In a preferred embodiment of the present invention, the first current mirror includes a first current mirror transistor and a second current mirror transistor, a gate of the first current mirror transistor being coupled to a gate of the second current mirror transistor, and being coupled to a drain of the first current mirror transistor and to a drain of the first current mirror control transistor, a source of the first current mirror transistor and a source of the second current mirror transistor being coupled to a second voltage supply terminal, a drain of the second current mirror transistor being coupled to the second input circuit.

In a preferred embodiment of the present invention, the supplementary input device not only include first sub-current source but also include second sub-current source to receive pull-down control signal, and an output terminal is parallel-connected to second input pair constant current circuit and is serial-connected to second input circuit.

In a preferred embodiment of the present invention, the second sub-current source includes a second sub-current source control transistor, a gate of the second sub-current source control transistor being coupled to the pull-down control signal, a source of the second sub-current source control transistor being coupled to a second voltage supply terminal, a drain of the second sub-current source control transistor being coupled to the second input circuit.

In a preferred embodiment of the present invention, the second sub-current source includes a second sub-current source control transistor and a second sub-constant current source, a gate of the second sub-current source control transistor being coupled to the pull-down control signal, a source of the second sub-current source control transistor being coupled to the second sub-constant current source, a drain of the second sub-current source control transistor being coupled to the second input circuit.

In a preferred embodiment of the present invention, the second sub-current source includes a second current mirror unit, the second current mirror unit including a second current mirror and a second current mirror control transistor, a gate of the second current mirror control transistor being coupled to the pull-down control signal, a drain of the second current mirror control transistor being coupled to the second current mirror, a source of the second current mirror control transistor being coupled to a second voltage supply terminal via a second sub-constant current source or being coupled to a second voltage terminal directly, the second current mirror being parallel-connected to the first input pair constant current source and serial-connected to the first input circuit.

In a preferred embodiment of the present invention, the second current mirror includes a third current mirror transistor and a fourth current mirror transistor, a gate of the third current mirror transistor being coupled to a gate of the fourth current mirror transistor, and being coupled to a drain of the third current mirror transistor and to a drain of the second current mirror control transistor, a source of the third current mirror transistor and a source of the fourth current mirror transistor being coupled to a first voltage supply terminal, a drain of the fourth current mirror transistor being coupled to the first input circuit.

The present invention provides a method for increasing a slew rate of an operational amplifier, the operational amplifier including an input stage and an output stage, the input stage receiving an input signal, the operational amplifier amplifying the input signal, the output stage outputting an output signal via an output terminal, the output signal being the amplified input signal, the method comprising: using a gate driving voltage of the output stage to provide a supplementary output current to the output terminal and to provide a supplementary input current to the input stage in order to increase the slew rate of the operational amplifier.

In a preferred embodiment of the present invention, when a voltage level of the output signal is not substantially equal to a voltage level of the input signal, the output stage controls a supplementary output device to provide the output stage with the supplementary output current and controls a supplementary input device to provide the input stage with the supplementary input current; when the voltage level of the output signal is substantially equal to the voltage level of the input signal, the supplementary input device and the supplementary output device stops outputting the supplementary input current to the input stage and the supplementary output current to the output stage.

In a preferred embodiment of the present invention, the step of using a gate driving voltage of the output stage to provide the supplementary output current to the output terminal and to provide the supplementary input current to the input stage includes: attenuating a gate voltage of the output stage; and a supplementary output device based on the attenuated gate voltage generating the supplementary output current to the output stage and a supplementary input device based on the attenuated gate voltage generating the supplementary input current to the input stage.

In a preferred embodiment of the present invention, the step of attenuating the gate voltage of the output stage includes serial-connecting a voltage source to the gate voltage of the output stage, or includes using a voltage level shift procedure.

In a preferred embodiment of the present invention, the step of the supplementary input stage based on the attenuated gate voltage generating the supplementary input current to the input stage includes adding an input pair current to the input stage, the input pair current being controlled by the gate voltage of the output stage to accelerate increasing and decreasing the attenuated gate voltage of the output stage. In another preferred embodiment of the present invention, the input pair current to the input stage includes a constant current source providing a constant current to accelerate increasing and decreasing the attenuated gate voltage of the output stage.

In a preferred embodiment of the present invention, the step of the supplementary input stage based on the attenuated gate voltage generating the supplementary input current to the input stage includes adding a current mirror stage to the input stage, the current mirror stage being controlled by the attenuated gate voltage of the output stage providing a current to the input stage to accelerate increasing and decreasing the gate voltage of the output stage. In a preferred embodiment of the present invention, the current mirror stage includes a constant current source providing a constant current to accelerate increasing and decreasing the gate voltage of the output stage.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

The present invention provides an apparatus for increasing a slew rate of an operational amplifier. It uses a monitoring control device controlled by the output stage to control the supplementary input/output device in order to increase the slew rate of an operational amplifier. It is different from the conventional operational amplifier with a high slew rate, which uses the error amplifier to monitor the voltage difference between the input terminal and the output terminal in order to control the output stage. The present invention uses a totally different concept to use the operational amplifier to drive a heavy capacitor loading (30 pF-600 pF) and has the advantages of low static current, high slew rate, small chip size and compact structure. Unlike the present invention, the conventional operational amplifier with a high slew rate does not provide low static current, small chip size and compact structure.

The apparatus for increasing a slew rate of an operational amplifier of the present invention does not monitor the input and output terminals, but uses a new output stage with a high driving ability in addition to the original output stage. This additional output stage is controlled by the control signal of the original output stage. When the output catches up with the input, the additional output stage will be turned off automatically. Otherwise, it will provide a high current to the output terminal. Likewise, a current source controlled by the control signal of the original output stage will be provided to the input pair. When the output catches up with the input, the current source will be turned off automatically.

Figure 2:
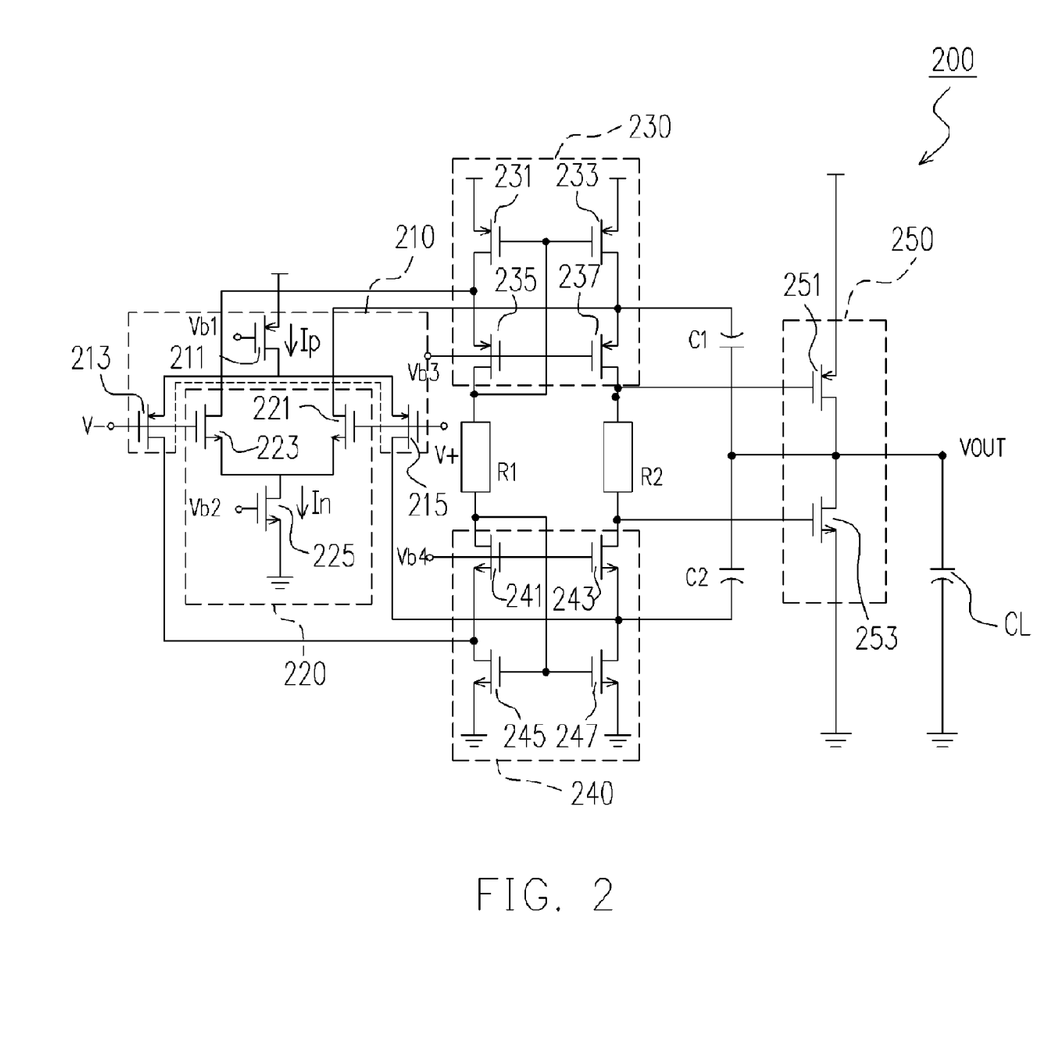
FIG. 2 shows a rail-to-rail amplifier.

FIG. 2 shows a rail-to-rail amplifier 200. The P-type input pair 210 includes three P-type transistors 211, 213, and 215. The P-type transistor 211 is the current source. The N-type input pair 220 includes three N-type transistors 221, 223, and 225. The N-type transistor 225 is the current source. The P-type active load 230 includes P-type transistors 231, 233, 235, and 237. The N-type active load 240 includes N-type transistors 241, 243, 245, and 247. The output stage 250 includes a P-type transistor 251 and a N-type transistor 253 serial-connected together.

The non-inverting input terminal V+ is coupled to the gates of the P-type transistor 215 and the N-type transistor 221. The inverting input terminal V− is coupled to the gates of the P-type transistor 213 and the N-type transistor 223. The drains of the P-type transistor 251 and the N-type transistor 253 of the output stage are coupled together and are coupled to the output terminal VOUT. The drains of the P-type transistors 213 and 215 are coupled to the N-type active load 240. The drains of the N-type transistors 221 and 223 are coupled to the P-type active load 230. The P-type active load is coupled to the N-type active load via the resistors R1 and R2. The gate of the P-type transistor 251 of the output stage 250 is coupled to between the P-type active load 230 and the resistor R2. The gate of the N-type transistor 253 of the output stage 250 is coupled to between the N-type active load 240 and the resistor R2. The compensation capacitor C1 is coupled to between the P-type transistors 233 and 237 of the P-type active load 230. The other end of the compensation capacitor C1 is coupled to the output terminal VOUT of the output stage 250. The compensation capacitor C2 is coupled to between the N-type transistors 243 and 247 of the N-type active load 240. The other end of the compensation capacitor C2 is coupled to the output terminal VOUT of the output stage 250.

Vb1–Vb4 are bias voltages for setting the operation range of the transistors. As shown in FIG. 2, the bias voltage Vb1 is coupled to the gate of the transistor 211 of the P-type input pair 210 to bias the transistor 211 in order to control the current source. The bias voltage Vb2 is coupled to the gate of the transistor 225 of the N-type input pair 220 to bias the transistor 225 in order to control the current source. The bias voltage Vb3 is coupled to the P-type transistors 235 and 237 of the P-type active load 230 in order to control the bias status. The bias voltage Vb4 is coupled to the N-type transistors 241 and 243 of the N-type active load 240 in order to control the bias status. The capacitor CL is the load the operational amplifier is going to drive.

In the above rail-to-rail amplifier 200, the P-type transistor 211 provides the P-type input pair 210 with a constant current Ip; the N-type transistor 225 provides the N-type input pair 220 with a constant current In. When the voltage V+ at the non-inverting terminal and the voltage V− at the inverting terminal are equal, the constant current Ip will uniformly flow through the P-type transistors 213 and 215, which is half of the constant current Ip; the constant current In will uniformly flow through the N-type transistors 221 and 223, which is half of the constant current In.

When the voltage V+ at the non-inverting terminal is higher than the voltage V− at the inverting terminal, the constant current Ip will flow through the P-type transistors 213 only; the constant current In will flow through the N-type transistors 221 only. The constant current In will flow into the P-type active load 230 so as to increase the source-gate voltage $V_{SG}$ of the P-type transistor 251 of the output stage 250 in order to provide the load CL with the current. The constant current Ip will flow into the N-type active load 240 so as to reduce the gate-source voltage $V_{GS}$ of the N-type transistor 253 of the output stage 250 in order to reduce the current flowing through the load CL.

When the voltage V+ at the non-inverting terminal is lower than the voltage V− at the inverting terminal, the constant current Ip will flow through the P-type transistors 215 only; the constant current In will flow through the N-type transistors 223 only. The constant current In will flow into the P-type active load 230 so as to reduce the source-gate voltage $V_{SG}$ of the P-type transistor 251 of the output stage 250 in order to reduce the current flowing through the load CL. The constant current Ip will flow into the N-type active load 240 so as to increase the gate-source voltage $V_{GS}$ of the N-type transistor 253 of the output stage 250 in order to increase the current flowing through the load CL.

The resistors R1 and R2 form the device of the operational amplifier 200 to control the static current consumption. The resistors R1 and R2 can also be replaced by conducting devices such as transistors.

Figure 3:
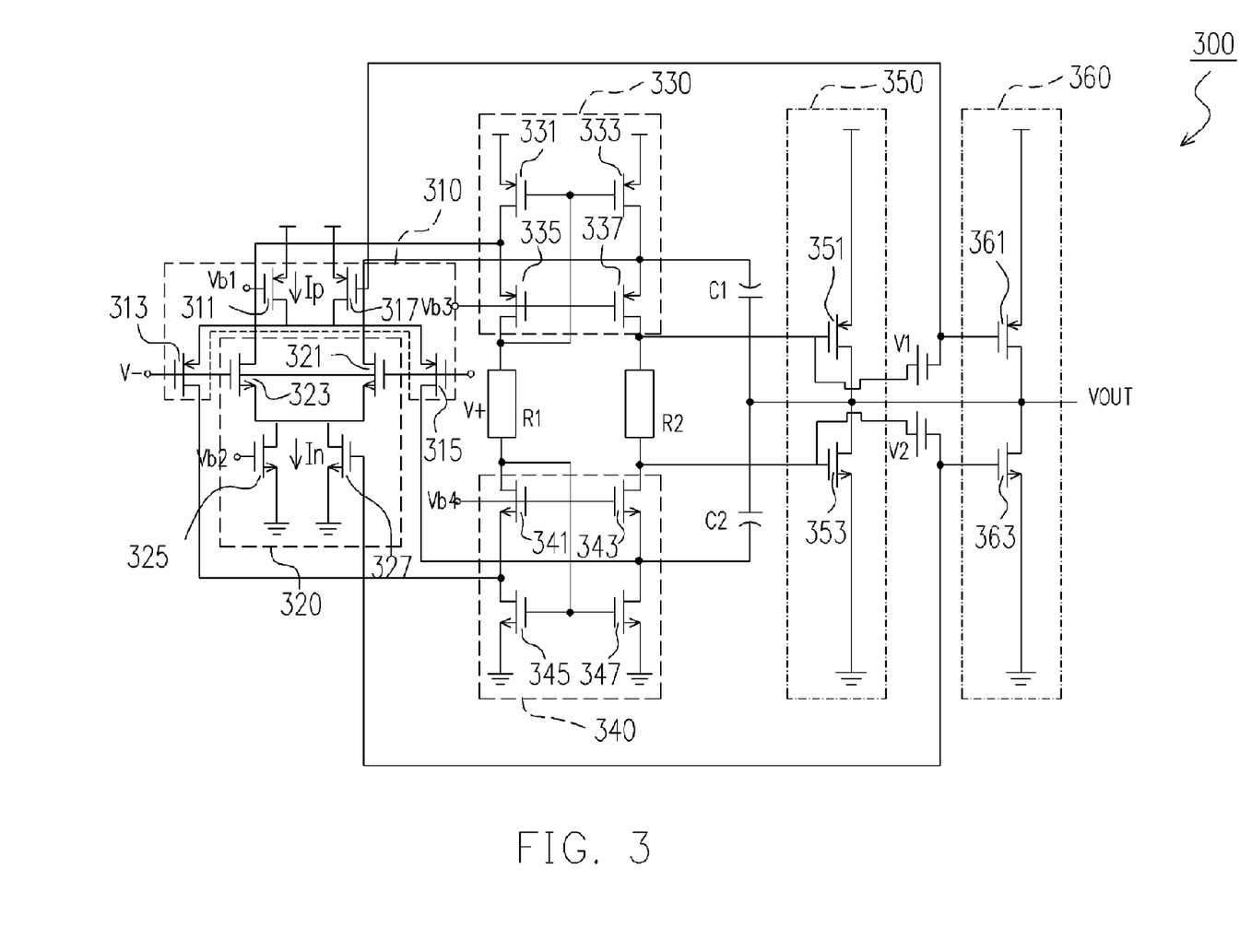
FIG. 3 shows the apparatus for increasing a slew rate of an operational amplifier in accordance with a preferred embodiment of the present invention.

In an embodiment of the present invention, to achieve the above objects, a supplementary input device and supplementary output device are added into the original output stage. The supplementary can provide an additional current to the load. The supplementary input device can increase the efficiency of charging the compensation capacitor. FIG. 3 shows the apparatus 300 for increasing a slew rate of an operational amplifier in accordance with a preferred embodiment of the present invention. There is a supplementary output device 360 and supplementary input device including a P-type transistor 317 and a N-type transistor 327.

In the apparatus 300 for increasing a slew rate of an operational amplifier, the P-type input pair 310 includes first input circuit (313,315), first input pair constant current circuit (311) and supplementary input device(317). The P-type transistors 311 and 317 are the current sources. The N-type input pair 320 includes second input circuit (321 and 323), second input pair constant current circuit (325) and supplementary input device(327). The N-type transistor 325 and 327 are the current sources. The P-type active load 330(i.e. first current source circuit) includes P-type transistors 331, 333, 335, and 337. The N-type active load 340(i.e. second current source circuit) includes N-type transistors 341, 343, 345, and 347. The output stage 350 includes a P-type transistor (i.e. first output transistor) 351 and a N-type transistor (i.e. second output transistor) 353 serial-connected together.

The non-inverting input terminal V+ is coupled to the gates of the P-type transistor 315 and the N-type transistor 321. The inverting input terminal V− is coupled to the gates of the P-type transistor 313 and the N-type transistor 323. The drains of the P-type transistor 351 and the N-type transistor 353 of the output stage 350 are coupled together and are coupled to the output terminal VOUT. The drains of the P-type transistors 313 and 315 are coupled to the N-type active load 340. The drains of the N-type transistors 321 and 323 are coupled to the P-type active load 330. The P-type active load 330 is coupled to the N-type active load 340 via the resistors R1 and R2. The gate of the P-type transistor 351 of the output stage 350 is coupled to between the P-type active load 330 and the resistor R2. The gate of the N-type transistor 353 of the output stage 350 is coupled to between the N-type active load 340 and the resistor R2. The compensation capacitor C1 is coupled to between the P-type transistors 333 and 337 of the P-type active load 330. The other end of the compensation capacitor C1 is coupled to the output terminal VOUT of the output stage 350. The compensation capacitor C2 is coupled to between the N-type transistors 343 and 347 of the N-type active load 340. The other end of the compensation capacitor C2 is coupled to the output terminal VOUT of the output stage 350.

Vb1–Vb4 are bias voltages for setting the operation range of the transistors. As shown in FIG.3, the bias voltage Vb1 is coupled to the gate of the transistor 311 of the P-type input pair 310 to bias the transistor 311 in order to control the current source. The bias voltage Vb2 is coupled to the gate of the transistor 325 of the N-type input pair 320 to bias the transistor 325 in order to control the current source. The bias voltage Vb3 is coupled to the P-type transistors 335 and 337 of the P-type active load 330 in order to control the bias status. The bias voltage Vb4 is coupled to the N-type transistors 341 and 343 of the N-type active load 240 in order to control the bias status.

The supplementary output device 360 is controlled by the control signal of the output stage 350, but the control signal will attenuate by the voltage sources V1 and V2 before entering into the supplementary output device 360. As shown in FIG. 3, the gate of the P-type transistor 351 of the output stage 350 is coupled to the gate of the P-type transistor 361 of the supplementary output device 360 via the voltage source V1, and is coupled to the gate of the P-type transistor 317 of the supplementary input device. The gate of the N-type transistor 353 of the output stage 350 is coupled to the gate of the N-type transistor 363 of the supplementary output device 360 via the voltage source V2, and is coupled to the gate of the N-type transistor 327 of the supplementary input device.

The voltage level of the voltage sources V1 and V2 can control the supplementary output device 360 at the output stage 350 not to provide the load with the additional current (i.e., the input is equal to the output). Because the voltage level drops, the gate voltage of the supplementary output device 360 is not high enough and is turned off. Likewise, the P-type transistor 317 and the N-type transistor 327 controlled by the voltage sources V1 and V2 (so-called the second input current source pair) are also turned off.

When the output is not equal to the input, because the gate-to-source voltage $V_{GS}$ of the PMOS or NMOS transistor of the output stage 350 becomes higher, the output stage 350 can provide an additional current to the load. Although the gate-source voltage $V_{GS}$ will pass through the voltage sources V1 and V2 before entering into the supplementary output device 360, if the gate voltage of the output stage 350 is high enough, the supplementary output device 360 will also provide a current to the load. Likewise, the supplementary input device also provides a current to the compensation capacitor. When the output is going to catch up with the input, because of the voltage sources, the supplementary output device 360 and the supplementary input device will be turned off to the original status. Because the supplementary input device will charge the compensation capacitor, the slew rate of the operational amplifier can be increased significantly. In addition, the supplementary output device 360 will compensate the insufficient driving ability of the output stage 350. Hence, the present invention can provide an operational amplifier with a high slew rate and a low static current.

Figure 4:
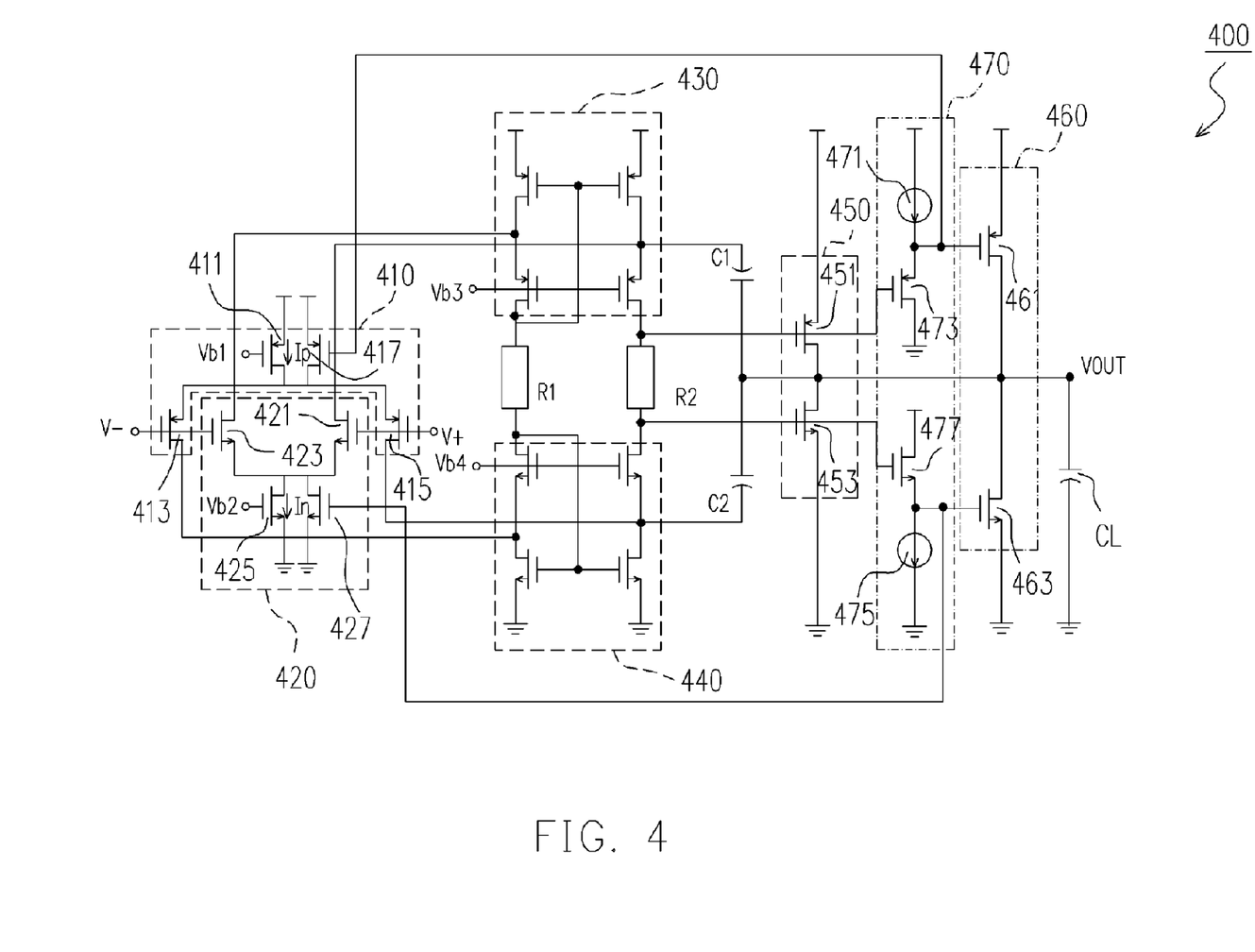
FIG. 4 shows the apparatus for increasing a slew rate of an operational amplifier in accordance with another preferred embodiment of the present invention.

In another embodiment of the present invention, to achieve the above objects, a supplementary output device and a supplementary input device are added to the original opamp. The supplementary output device can provide an additional current to the load. The supplementary input device can increase the efficiency of charging the compensation capacitor. Unlike the embodiment in FIG. 3 using the voltage sources V1 and V2 to attenuate the control signal, the function of the voltage sources V1 and V2 are replaced by the monitor control device 470. I.e., the control signal (gate voltage) of the output stage 450 will be adjusted by the voltage adjustment unit 470 before it enters into the supplementary output device 460 and the supplementary input device (i.e., the P-type transistor 417 in the P-type input pair 410 and the N-type transistor 427 in the N-type input pair 420).

Because in this embodiment the apparatus 400 for increasing a slew rate of an operational amplifier is almost the same as the apparatus 300 for increasing a slew rate of an operational amplifier in FIG. 3 except for the monitor control unit 470, it is only necessary to describe the operation of the monitor control device 470. The monitor control device 470 includes the pull-up attenuation unit consists of current source 471, the P-type transistor 473, the pull-down attenuation unit consists of current source 475, and the N-type transistor 477. The supplementary output device 460 includes the pull-up output unit (P-type transistor 461) and the pull-down output unit (N-type transistor 463). The current source 471 is coupled to the source of the P-type transistor 473 and coupled to the gate of P-type transistor 461 of the supplementary output device 460. The drain of the P-type transistor 473 is grounded. The gate of the P-type transistor 473 is coupled to the gate of the P-type transistor 451 of the output stage 450. The current source 475 is coupled to the source of the N-type transistor 477 and coupled to the gate of N-type transistor 463 of the supplementary output device 460. The drain of the N-type transistor 477 is coupled to the working voltage VDD. The gate of the N-type transistor 477 is coupled to the gate of the N-type transistor 453 of the output stage 450. The drain of the P-type transistor 461 of the supplementary output stage 460 is coupled to the drain of the drain of the N-type transistor 463 and coupled to the output terminal VOUT.

The gate of the P-type transistor 417 (first sub-current source control transistor) of the P-type input pair 410 is coupled to between the current source 471 and the P-type transistor 473; the drain of the P-type transistor 417 is coupled to the drain of the of the P-type transistor 411 (first input pair constant current source) and coupled to the sources of the P-type transistors 413 and 415(first input circuit). The gate of the N-type transistor 427(second sub-current source control transistor) of the N-type input pair 420 is coupled to between the current source 475 and the N-type transistor 477; the drain of N-type transistor 427 is coupled to the drain of the of the N-type transistor 425 (second input constant current source) and coupled to the sources of the P-type transistors 421 and 423(second input circuit). The non-inverting input terminal V+ of the apparatus 400 is coupled to the gates of the P-type transistor 415 and the N-type transistor 421. The inverting input terminal V− is coupled to the gates of the P-type transistor 413 and the N-type transistor 423.

When the voltage V+ at the non-inverting terminal and the voltage V− at the inverting terminal are equal, because the function of the P-type transistor 473 is for voltage level shift, the voltage level of the source of the P-type transistor 473 is equal to VDD. Hence, the P-type transistor 461 in the supplementary output device 460 and the P-type transistor 417 in the P-type input pair 410 cannot be turned on. Likewise, because the function of the N-type transistor 477 is for voltage level shift, the voltage level of the source of the N-type transistor 477 is equal to ground. Hence, the N-type transistor 463 in the supplementary output device 460 and the N-type transistor 427 in the N-type input pair 420 cannot be turned on.

When the voltage V+ at the non-inverting terminal is higher than the voltage V− at the inverting terminal, the current Ip flowing through the P-type transistors 411 will flow through the P-type transistors 413 only; the current In flowing through the N-type transistors 425 will flow through the N-type transistors 421 only. The current In will flow into the P-type active load 430 so as to increase the source-gate voltage $V_{SG}$ of the P-type transistor 451 of the output stage 450 in order to provide the load CL with the current. The current Ip will flow into the N-type active load 440 so as to reduce the gate-source voltage $V_{GS}$ of the N-type transistor 453 of the output stage 450 in order to reduce the current flowing through the load CL.

The gate voltages of the P-type transistor 451 and the N-type transistor 453 will be fed forward to the P-type transistor 461 and the N-type transistor 463 of the supplementary output device 460. Hence, the N-type transistor 463 will be turned off and the P-type transistor 461 will be turned on to provide an additional current to the load CL. The gate voltage of the P-type transistor 461 will be fed forward to the P-type transistor 417 of the P-type input pair 410 and to the N-type transistor 427 of the N-type input pair 420. Hence, the N-type transistor 427 will be turned off and the P-type transistor 417 will be turned on to provide an additional current to the P-type input pair 410. This current will flow into the N-type active load 440 via the P-type transistor 413 so as to accelerate the decrease of the gate-to-source voltage $V_{GS}$ of the N-type transistor 453 of the output stage and the increase of the source-to-gate voltage $V_{SG}$ of the P-type transistor 451 of the output stage. When accelerating the decrease of the gate-to-source voltage $V_{GS}$ of the N-type transistor 453 of the output stage and the increase of the source-to-gate voltage $V_{SG}$ of the P-type transistor 451 of the output stage, it would take shorter to provide the current to the load so as to increase the slew rate of the rising edge.

When the voltage V+ at the non-inverting terminal is lower than the voltage V− at the inverting terminal, the current Ip will flow through the P-type transistors 415 only; the 4 current In will flow through the N-type transistors 423 only. The 4 current In will flow into the P-type active load 430 so as to reduce the source-gate voltage $V_{SG}$ of the P-type transistor 451 of the output stage 450 in order to reduce the current flowing through the load CL. The 4 current Ip will flow into the N-type active load 440 so as to increase the gate-source voltage $V_{GS}$ of the N-type transistor 453 of the output stage 450 in order to increase the current flowing through the load CL. The gate voltages of the P-type transistor 451 and the N-type transistor 453 will be fed forward to the P-type transistor 461 and the N-type transistor 463 of the supplementary output stage 460. Hence, the P-type transistor 461 will be turned off and the N-type transistor 463 will be turned on to provide an additional current to the load CL.

The gate voltages of the P-type transistor 461 and of the N-type transistor 463 will be fed forward to the P-type transistor 417 of the P-type input pair 410 and to the N-type transistor 427 of the N-type input pair 420. Hence, the P-type transistor 417 will be turned off and the N-type transistor 427 will be turned on to provide an additional current to the N-type input pair 440. This current will flow into the P-type active load 430 via the N-type transistor 423 so as to accelerate the increase of the gate-to-source voltage $V_{GS}$ of the N-type transistor 453 of the output stage and the decrease of the source-to-gate voltage $V_{SG}$ of the P-type transistor 451 of the output stage. When accelerating the increase of the gate-to-source voltage $V_{GS}$ of the N-type transistor 453 of the output stage and the decrease of the source-to-gate voltage $V_{SG}$ of the P-type transistor 451 of the output stage, it would take shorter to provide the current to the load so as to increase the slew rate of the falling edge.

Figure 5:
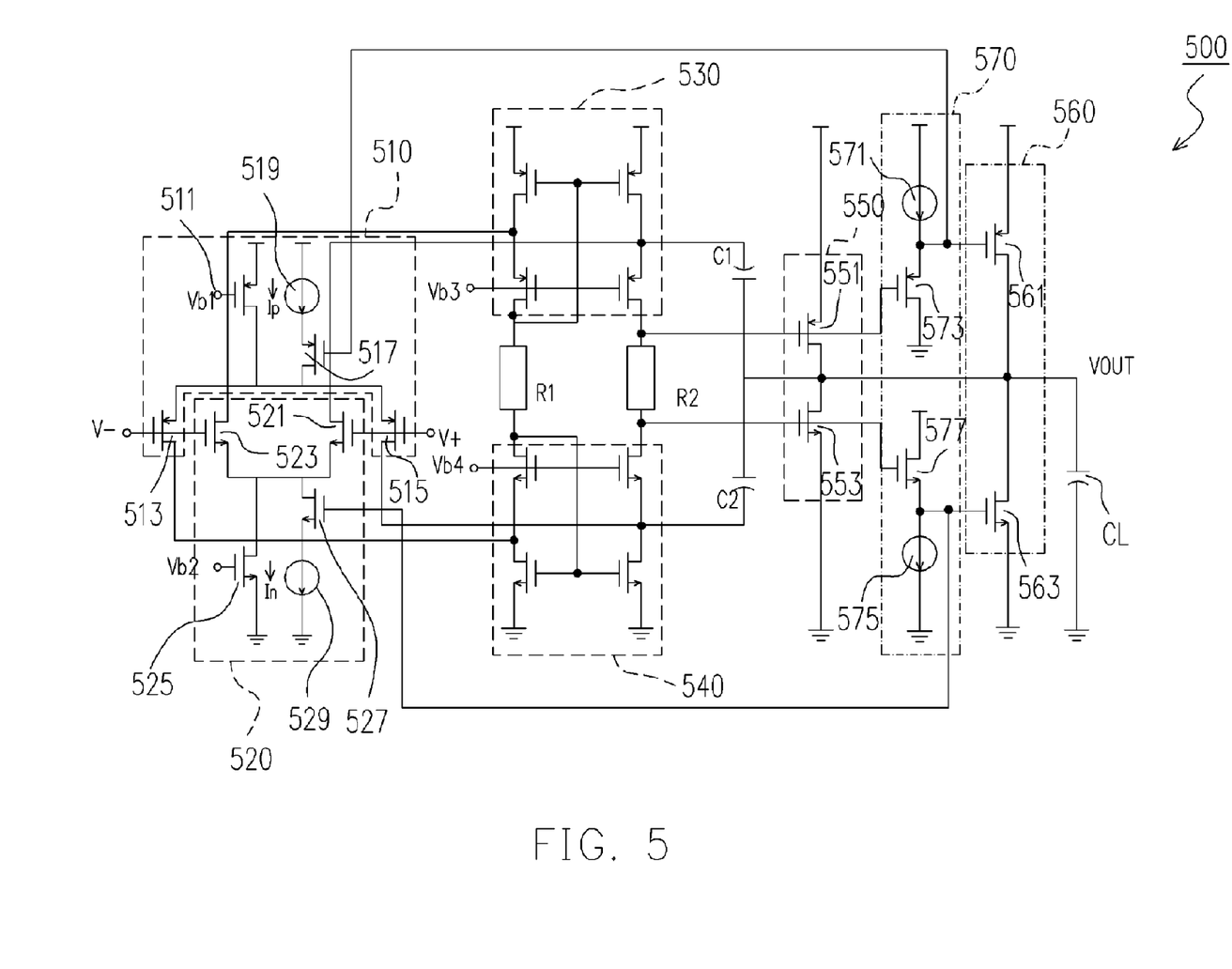
FIG. 5 shows the apparatus for increasing a slew rate of an operational amplifier in accordance with still another preferred embodiment of the present invention.

In another embodiment of the present invention, to achieve the above objects a supplementary output device and a supplementary input device are added to the original opamp. The supplementary output device can provide an additional current to the load. The supplementary input device can increase the efficiency of charging the compensation capacitor. Unlike the embodiment in FIG. 4, in the apparatus 500, the control signal(gate voltage) of the output stage 550 will be adjusted by the monitor control device 570 before it enters into the supplementary output device 560 and the supplementary input device (i.e., the first sub-current source control transistor 517 in the P-type input pair 510 and the second sub-current source control transistor 527 in the N-type input pair 520). In addition, a first sub-current source 519 is added into the P-type transistor 517 of the P-type input pair 510, and a second sub-current source 529 is added into the N-type transistor 527 of the N-type input pair 520. The non-inverting input terminal V+ of the apparatus 500 is coupled to the gates of the P-type transistor 515 and the N-type transistor 521. The inverting input terminal V− is coupled to the gates of the P-type transistor 513 and the N-type transistor 523.

When the voltage V+ at the non-inverting terminal and the voltage V− at the inverting terminal are equal, because the function of the P-type transistor 573 is for voltage level shift, the voltage level of the source of the P-type transistor 573 is equal to VDD. Hence, the P-type transistor 561 in the supplementary output device 560 and the P-type transistor 517 in the P-type input pair 510 cannot be turned on. Likewise, because the function of the N-type transistor 577 is for voltage level shift, the voltage level of the source of the N-type transistor 577 is equal to ground. Hence, the N-type transistor 563 in the supplementary output device 560 and the N-type transistor 527 in the N-type input pair 520 cannot be turned on.

When the voltage V+ at the non-inverting terminal is higher than the voltage V− at the inverting terminal, the current Ip flowing through the P-type transistors 511 will flow through the P-type transistors 513 only; the current In flowing through the N-type transistors 525 will flow through the N-type transistors 521 only. The current In will flow into the P-type active load 530 so as to increase the source-gate voltage $V_{SG}$ of the P-type transistor 551 of the output stage 550 in order to provide the load CL with the current. The current Ip will flow into the N-type active load 540 so as to reduce the gate-source voltage $V_{GS}$ of the N-type transistor 553 of the output stage 550 in order to reduce the current flowing through the load CL.

The gate voltages of the P-type transistor 551 and the N-type transistor 553 will be fed forward to the P-type transistor 561 and the N-type transistor 563 of the supplementary output device 560. Hence, the N-type transistor 563 will be turned off and the P-type transistor 561 will be turned on to provide an additional current to the load CL. The gate voltages of the P-type transistor 561 and the N-type transistor 563 will be fed forward to the P-type transistor 517 of the P-type input pair 510 and to the N-type transistor 527 of the N-type input pair 520. Hence, the N-type transistor 527 will be turned off and the P-type transistor 517 will be turned on provide a constant current to the P-type input pair 510. This current will flow into the N-type active load 540 via the P-type transistor 513 so as to accelerate the decrease of the gate-to-source voltage $V_{GS}$ of the N-type transistor 553 of the output stage and the increase of the source-to-gate voltage $V_{SG}$ of the P-type transistor 551 of the output stage. When accelerating the decrease of the gate-to-source voltage $V_{GS}$ of the N-type transistor 553 of the output stage and the increase of the source-to-gate voltage $V_{SG}$ of the P-type transistor 551 of the output stage, it would take shorter to provide the current to the load so as to increase the slew rate of the rising rate.

When the voltage V+ at the non-inverting terminal is lower than the voltage V− at the inverting terminal, the current Ip will flow through the P-type transistors 515 only; the current In will flow through the N-type transistors 523 only. The current In will flow into the P-type active load 530 so as to reduce the source-gate voltage $V_{SG}$ of the P-type transistor 551 of the output stage 550 in order to reduce the current flowing through the load CL. The current Ip will flow into the N-type active load 540 so as to increase the gate-source voltage $V_{GS}$ of the N-type transistor 553 of the output stage 550 in order to increase the current flowing through the load CL.

The gate voltages of the P-type transistor 551 and the N-type transistor 553 will be fed forward to the P-type transistor 561 and the N-type transistor 563 of the supplementary output device 560. Hence, the P-type transistor 561 will be turned off and the N-type transistor 563 will be turned on to provide an additional current to the load CL. The gate voltages of the P-type transistor 561 and of the N-type transistor 563 will be fed forward to the P-type transistor 517 of the P-type input pair 510 and to the N-type transistor 527 of the N-type input pair 520. Hence, the P-type transistor 517 will be turned off and the N-type transistor 527 will be turned on to provide a constant current 529 to the N-type input pair 520. This current 529 will flow into the P-type active load 530 via the N-type transistor 523 so as to accelerate the increase of the gate-to-source voltage $V_{GS}$ of the N-type transistor 553 of the output stage and the decrease of the source-to-gate voltage $V_{SG}$ of the P-type transistor 551 of the output stage. When accelerating the increase of the gate-to-source voltage $V_{GS}$ of the N-type transistor 553 of the output stage and the decrease of the source-to-gate voltage $V_{SG}$ of the P-type transistor 551 of the output stage, it would take shorter to provide the current to the load so as to increase the slew rate of the falling edge.

Figure 6:
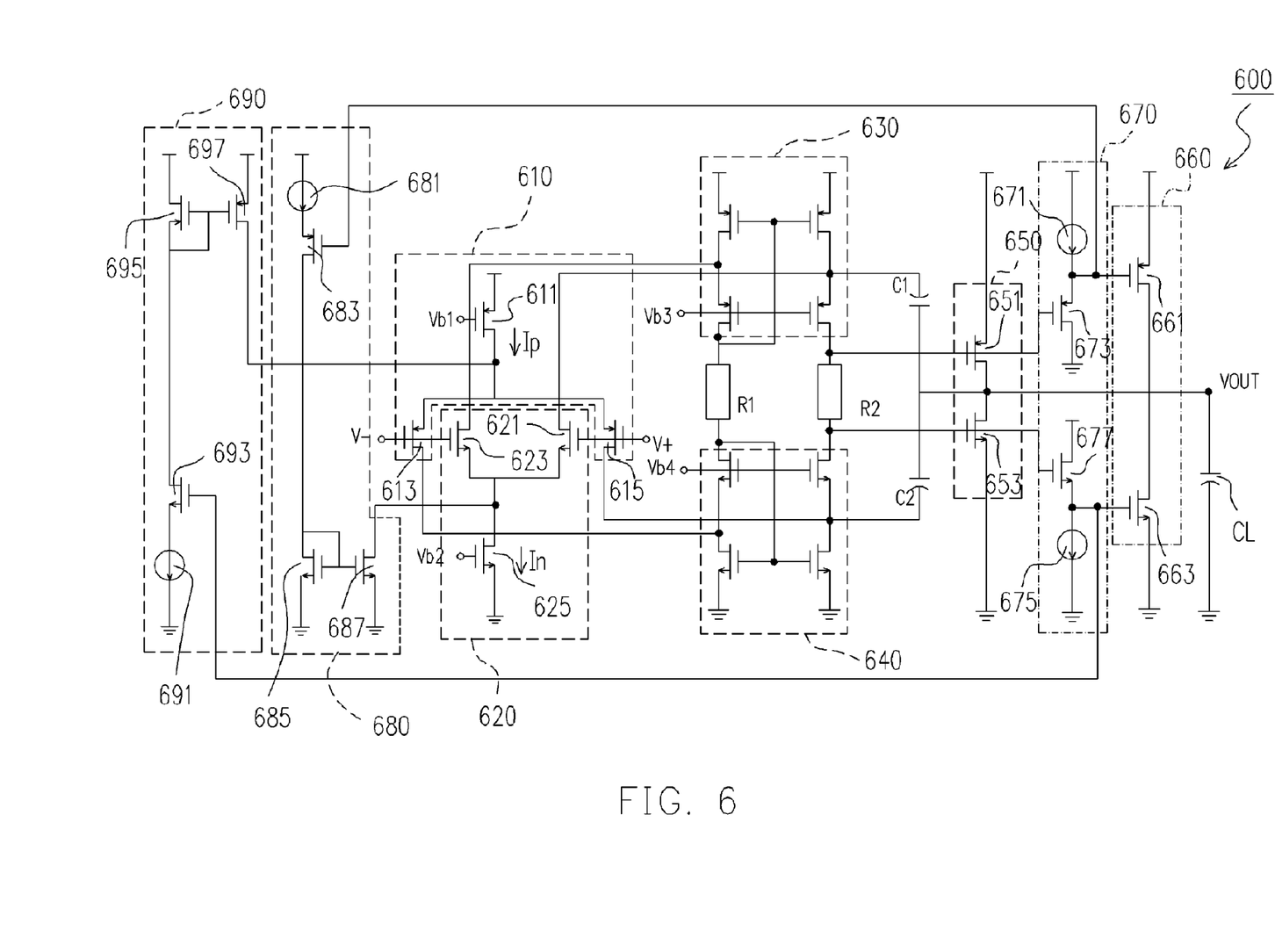
FIG. 6 shows the apparatus for increasing a slew rate of an operational amplifier in accordance with still another preferred embodiment of the present invention.

In another embodiment of the present invention, to achieve the above objects a supplementary output device and a supplementary input device are added to the original opamp. The supplementary output device can provide an additional current to the load. The supplementary input device can increase the efficiency of charging the compensation capacitor. Unlike the embodiment in FIG. 5, in the apparatus 600, the control signal (gate voltage) of the output stage 650 will be adjusted by the monitor control device 670 before it enters into the supplementary output device and supplementary input device. Compared to the supplementary input device (i.e., the first sub-current source control transistor 517 in the P-type input pair 510 and the second sub-current source control transistor 527 in the N-type input pair 520) in FIG. 5, in this embodiment, the first/second sub-current source is replaced by the first/second current mirror units 680 and 690. The non-inverting input terminal V+ of the apparatus 600 is coupled to the gates of the P-type transistor 615 and the N-type transistor 621. The inverting input terminal V− is coupled to the gates of the P-type transistor 613 and the N-type transistor 623.

Referring to FIG. 6, the first current mirror unit 680 includes first current mirror having first/second current mirror transistors 685 and 687, a first current mirror control transistor 683, and a first sub-current source 681; the second current mirror unit 690 includes second current mirror having third/fourth current mirror transistors 695 and 697, a second current mirror control transistor 693, and a second sub-current source 691.

In the second current mirror unit 690, the gates of the P-type transistors 695 and 697 are coupled together and are coupled to the drain of the P-type transistors 695 and are coupled to the drain of the N-type transistor 693. The sources of the P-type transistors 695 and 697 are coupled to the working voltage VDD. The source of the N-type transistor 693 is coupled to the ground (GND) via the constant current source 691. The gate of the N-type transistor 693 is coupled to the gate of the N-type transistor 663 of the supplementary output stage 660. The drain of the P-type transistor 697 is coupled to the drain of the P-type transistor 611 of the P-type input pair 610. In this embodiment, although the sources of the P-type transistors 695 and 697 are coupled to the working voltage VDD, and the constant current source 691 is coupled to the ground (GND), one skilled in the art would know that these two voltage terminals can be two independent voltage supply terminals.

In the first current mirror unit 680, the gates of the N-type transistors 685 and 687 are coupled together and are coupled to the drain of the N-type transistors 685 and are coupled to the drain of P-type transistor 683. The sources of the N-type transistors 685 and 687 are coupled together and are coupled to the ground GND. The source of the P-type transistor 683 is coupled to the working voltage VDD via the constant current source 681. The gate of the P-type transistor 683 is coupled to the gate of the P-type transistor 661 of the supplementary output stage 660. The drain of the N-type transistor 687 is coupled to the drain of the N-type transistor 625 of the N-type input pair 620.

When the voltage V+ at the non-inverting terminal and the voltage V− at the inverting terminal are equal, because the function of the P-type transistor 673 is for voltage level shift, the voltage level of the source of the P-type transistor 673 is equal to VDD. Hence, the P-type transistor 661 in the supplementary output stage device and the first current mirror control transistor 683 in the first current mirror unit 680 can not be turned on. Likewise, because the function of the N-type transistor 677 is for voltage level shift, the voltage level of the source of the N-type transistor 677 is equal to ground. Hence, the N-type transistor 663 in the supplementary output device 660 and the second current mirror control transistor 693 in the second current mirror unit 690 cannot be turned on.

When the voltage V+ at the non-inverting terminal is higher than the voltage V− at the inverting terminal, the current Ip flowing through the P-type transistor 611 will flow through the P-type transistors 613 only; the current In flowing through the N-type transistor 625 will flow through the N-type transistors 621 only. The current In will flow into the P-type active load 630 so as to increase the source-gate voltage $V_{SG}$ of the P-type transistor 651 of the output stage 650 in order to provide the load CL with the current. The current Ip will flow into the N-type active load 640 so as to reduce the gate-source voltage $V_{GS}$ of the N-type transistor 653 of the output stage 650 in order to reduce the current flowing through the load CL.

The gate voltages of the P-type transistor 651 and the N-type transistor 653 will be fed forward to the P-type transistor 661 and the N-type transistor 663 of the supplementary output device 660. Hence, the N-type transistor 663 will be turned off and the P-type transistor 661 will be turned on to provide an additional current to the load CL.

The gate voltages of the P-type transistor 651 and the N-type transistor 653 will be fed forward to the first current mirror control transistor 683 of the first current mirror unit 680 and to the second current mirror control transistor 693 of the second current mirror unit 690. Hence, the second current mirror control transistor 693 will be turned off and the first current mirror control transistor 683 will be turned on. Hence the current of the first sub-current source 681 will flow into the N-type input pair 620 via the first current mirror control transistor 683, first current mirror transistor 685, and second current mirror transistor 687. This current will flow into the P-type active load 630 via the N-type transistor 621 so as to accelerate the decrease of the gate-to-source voltage $V_{GS}$ of the N-type transistor 653 of the output stage and the increase of the source-to-gate voltage $V_{SG}$ of the P-type transistor 651 of the output stage. When accelerating the decrease of the gate-to-source voltage $V_{GS}$ of the N-type transistor 653 of the output stage and the increase of the source-to-gate voltage $V_{SG}$ of the P-type transistor 651 of the output stage, it would take shorter to provide the current to the load so as to increase the slew rate of the rising edge.

When the voltage V+ at the non-inverting terminal is lower than the voltage V− at the inverting terminal, the current Ip flowing through the P-type transistors 611 will flow through the P-type transistors 615 only; the current In flowing through the N-type transistors 625 will flow through the N-type transistors 623 only. The current In will flow into the P-type active load 630 via the N-type transistor 623 so as to decrease the source-gate voltage $V_{SG}$ of the P-type transistor 651 of the output stage 650 in order to reduce the current to the load CL. The current Ip will flow into the N-type active load 640 so as to increase the gate-source voltage $V_{GS}$ of the N-type transistor 653 of the output stage 650 in order to increase the current flowing through the load CL.

The gate voltages of the P-type transistor 651 and the N-type transistor 653 will be fed forward to the P-type transistor 661 and the N-type transistor 663 of the supplementary output device 660. Hence, the P-type transistor 661 will be turned off and the N-type transistor 663 will be turned on to provide an additional current to the load CL.

The gate voltages of the P-type transistor 651 and the N-type transistor 653 will be fed forward to the first current mirror control transistor 683 of the first current mirror unit 680 and to the second current mirror control transistor 693 of the second current mirror unit 690. Hence, the first current mirror control transistor 683 will be turned off and the second current mirror control transistor 693 will be turned on to provide the current of second sub-current source 691 to the P-type input pair 610 via the second current mirror control transistor 693, the third current mirror transistor 695, and the fourth current mirror transistor 697. This current will flow into the N-type active load 640 via the P-type transistor 615 so as to accelerate the increase of the gate-to-source voltage $V_{GS}$ of the N-type transistor 653 of the output stage and the decrease of the source-to-gate voltage $V_{SG}$ of the P-type transistor 651 of the output stage. When accelerating the increase of the gate-to-source voltage $V_{GS}$ of the N-type transistor 653 of the output stage and the decrease of the source-to-gate voltage $V_{SG}$ of the P-type transistor 651 of the output stage, it would take shorter to provide the current to the load so as to increase the slew rate of the falling edge.

Figure 7:
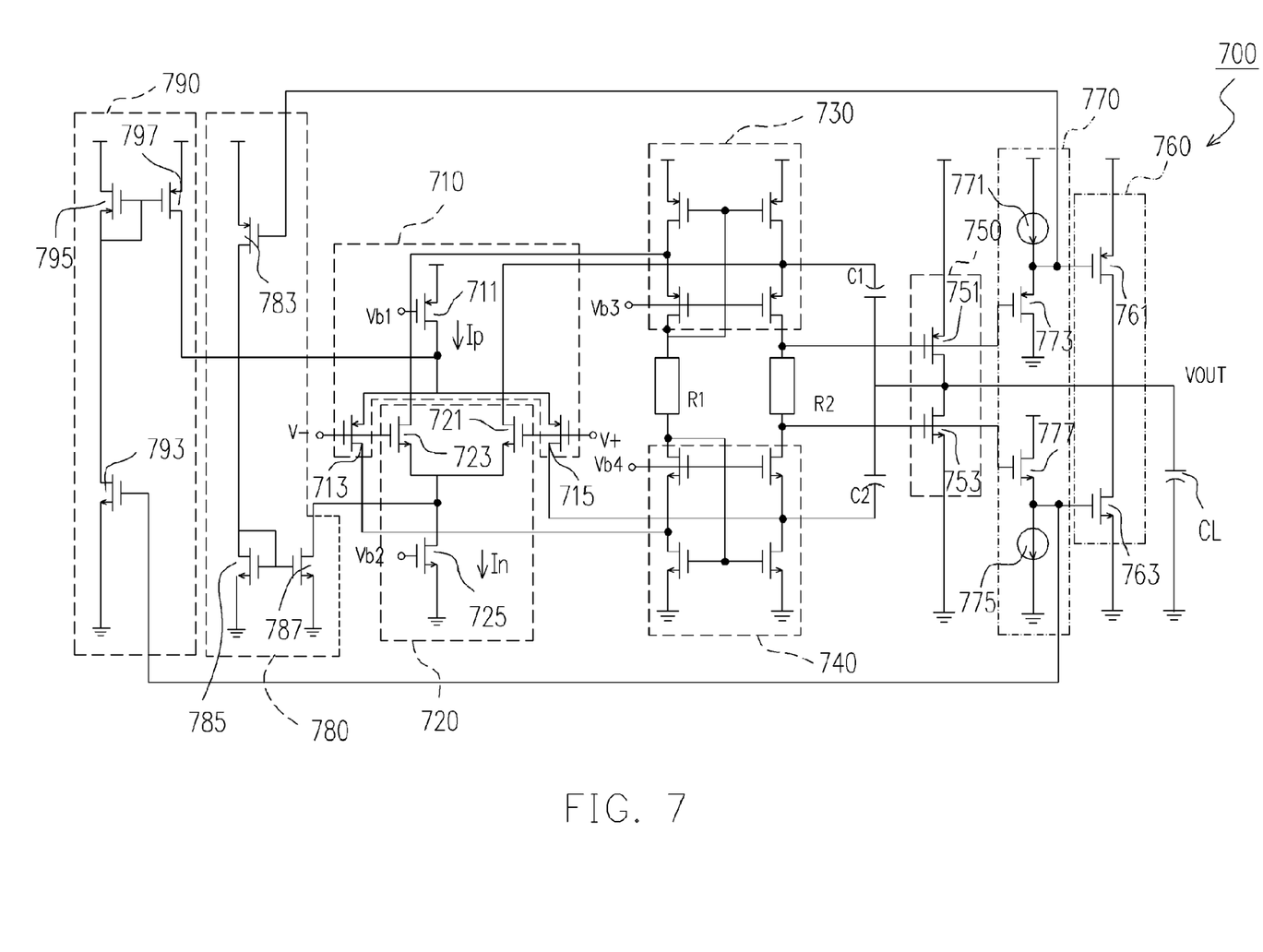
FIG. 7 shows the apparatus for increasing a slew rate of an operational amplifier in accordance with still another preferred embodiment of the present invention.

In another embodiment of the present invention, to achieve the above objects a supplementary output device and supplementary input device are added to the original output stage. The additional output stage can provide an additional current to the load. The second input current source pair can increase the efficiency of charging the compensation capacitor. Unlike the embodiment in FIG. 6, in the apparatus 700, the output of the output stage 750 will be adjusted by the voltage adjustment unit 770. Compared to the current mirror units 680 and 690 in FIG. 6, in this embodiment, the current mirror units 680 and 690 are replaced by the current generating units 780 and 790. The non-inverting input terminal V+ of the apparatus 700 is coupled to the gates of the P-type transistor 715 and the N-type transistor 721. The inverting input terminal V− is coupled to the gates of the P-type transistor 713 and the N-type transistor 723.

In the current generating unit 790, the gates of the P-type transistors 795 and 797 are coupled together and are coupled to the drain of the P-type transistors 795. The sources of the P-type transistors 795 and 797 are coupled together and are coupled to the working voltage VDD. The source of the N-type transistor 793 is coupled to the ground (GND). The gate of the N-type transistor 793 is coupled to the gate of the N-type transistor 763 of the supplementary output stage 760. The drain of the P-type transistor 797 is coupled to the drain of the P-type transistor 711 of the P-type input pair 710. In this embodiment, working voltage VDD and the ground (GND) can be two independent voltage supply terminals.

In the current generating unit 780, the gates of the N-type transistors 785 and 787 are coupled together and are coupled to the drain of the N-type transistors 785. The sources of the N-type transistors 785 and 787 are coupled together and are coupled to the ground GND. The source of the P-type transistor 783 is coupled to the working voltage VDD. The gate of the P-type transistor 783 is coupled to the gate of the P-type transistor 761 of the supplementary output stage 760. The drain of the N-type transistor 787 is coupled to the drain of the N-type transistor 725 of the N-type input pair 720.

When the voltage V+ at the non-inverting terminal and the voltage V− at the inverting terminal are equal, because the function of the P-type transistor 773 is for voltage level shift, the voltage level of the source of the P-type transistor 773 is equal to VDD. Hence, the P-type transistor 761 in the supplementary output stage 760 and the P-type transistor 783 in the P-type current generating 780 cannot be turned on. Likewise, because the function of the N-type transistor 777 is for voltage level shift, the voltage level of the source of the N-type transistor 777 is equal to ground. Hence, the N-type transistor 763 in the supplementary output stage 760 and the N-type transistor 793 in the N-type current generating unit 790 cannot be turned on.

When the voltage V+ at the non-inverting terminal is higher than the voltage V− at the inverting terminal, the current Ip flowing through the P-type transistor 711 will flow through the P-type transistors 713 only; the current In flowing through the N-type transistor 725 will flow through the N-type transistors 721 only. The current In will flow into the P-type active load 730 so as to increase the source-gate voltage $V_{SG}$ of the P-type transistor 751 of the output stage 750 in order to provide the load CL with the current. The current Ip will flow into the N-type active load 740 so as to reduce the gate-source voltage $V_{GS}$ of the N-type transistor 753 of the output stage 750 in order to reduce the current flowing through the load CL.

The gate voltages of the P-type transistor 751 and the N-type transistor 753 will be fed forward to the P-type transistor 761 and the N-type transistor 763 of the supplementary output stage 760. Hence, the N-type transistor 763 will be turned off and the P-type transistor 761 will be turned on to provide an additional current to the load CL.

The gate voltages of the P-type transistor 751 and the N-type transistor 753 will be fed forward to the P-type transistor 783 of the P-type current generating 780 and to the N-type transistor 793 of the N-type current generating unit 790. Hence, the N-type transistor 793 will be turned off and the P-type transistor 783 will be turned on. Hence the high current controlled by the P-type transistor 783 will flow into the N-type input pair 720 via the P-type transistor 783, N-type transistor 785, and N-type transistor 787. This current will flow into the P-type active load 730 via the N-type transistor 721 so as to accelerate the decrease of the gate-to-source voltage $V_{GS}$ of the N-type transistor 753 of the output stage and the increase of the source-to-gate voltage $V_{SG}$ of the P-type transistor 751 of the output stage. When accelerating the decrease of the gate-to-source voltage $V_{GS}$ of the N-type transistor 753 of the output stage and the increase of the source-to-gate voltage $V_{SG}$ of the P-type transistor 751 of the output stage, it would take shorter to provide the current to the load so as to increase the slew rate of the rising edge.

When the voltage V+ at the non-inverting terminal is lower than the voltage V− at the inverting terminal, the current Ip flowing through the P-type transistors 711 will flow through the P-type transistors 715 only; the current In flowing through the N-type transistors 725 will flow through the N-type transistors 723 only. The current In will flow into the P-type active load 730 via the N-type transistor 723 so as to decrease the source-gate voltage $V_{SG}$ of the P-type transistor 751 of the output stage 750 in order to reduce the current to the load CL. The current Ip will flow into the N-type active load 740 so as to increase the gate-source voltage $V_{GS}$ of the N-type transistor 753 of the output stage 750 in order to increase the current flowing through the load CL.

The gate voltages of the P-type transistor 751 and the N-type transistor 753 will be fed forward to the P-type transistor 761 and the N-type transistor 763 of the supplementary output stage 760. Hence, the P-type transistor 761 will be turned off and the N-type transistor 763 will be turned on to provide an additional current to the load CL.

The gate voltages of the P-type transistor 751 and the N-type transistor 753 will be fed forward to the P-type transistor 783 of the P-type current generating 780 and to the N-type transistor 793 of the N-type current generating 790. Hence, the P-type transistor 783 will be turned off and the N-type transistor 793 will be turned on provide a high current to the P-type input pair 710 via the N-type transistor 793, the P-type transistor 795, and the P-type transistor 797. This current will flow into the N-type active load 740 via the P-type transistor 715 so as to accelerate the increase of the gate-to-source voltage $V_{GS}$ of the N-type transistor 753 of the output stage and the decrease of the source-to-gate voltage $V_{SG}$ of the P-type transistor 751 of the output stage. When accelerating the increase of the gate-to-source voltage $V_{GS}$ of the N-type transistor 753 of the output stage and the decrease of the source-to-gate voltage $V_{SG}$ of the P-type transistor 751 of the output stage, it would take shorter to provide the current to the load so as to increase the slew rate of the rising rate of the falling edge.

In light of the above embodiments, the apparatus for increasing a slew rate of an operational amplifier of the present invention only requires an operational amplifier, a monitoring control device, a push-pull output device, and a second input current source pair. It uses a monitoring control device controlled by the output stage to control the supplementary device and the second input current source pair in order to increase a slew rate of an operational amplifier. This operational amplifier also provides the rail-to-rail output function. In addition, because it does not require additional circuit to increase the slew rate, the chip size is smaller. With respect to the circuit structure, it is very simple and can be applied to the pre-existing operational amplifier without re-designing the operational amplifier and thus can keep the original characteristics of the operational amplifier. Hence, the apparatus for increasing a slew rate of an operational amplifier of the present invention have the advantages of low static current, high slew rate, small chip size, and compact structure.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An apparatus for increasing a slew rate of an operational amplifier, comprising:
    an operational amplifier having an input stage and an output stage, said input stage receiving an input signal, said operational amplifier amplifying said input signal, said output stage outputting an output signal, said output signal being said amplified input signal;
    a supplementary output device coupled to said output stage of said operational amplifier, said supplementary device being controlled by said output stage; and
    a supplementary input device coupled to said input stage of said operational amplifier, said supplementary input device being controlled by said output stage;
    wherein when a voltage level of said output signal is not substantially equal to a voltage level of said input signal, said output stage controls said supplementary output device to provide said output stage with a supplementary output current and controls said supplementary input device to provide said input stage with a supplementary input current; when said voltage level of said output signal is substantially equal to said voltage level of said input signal, said supplementary input device and said supplementary output device is off and do not provide said supplementary input current and said supplementary output current.

2. The apparatus of claim 1, wherein said input stage of said operational amplifier includes:
    a first input circuit and a second input circuit, said first input circuit and said second input circuit being respectively coupled to a control electrode of a non-inverting input terminal and an inverting input terminal of said operational amplifier;
    a first current source circuit coupled to said second input circuit and pushed by said second input circuit;
    a second current source circuit coupled to said first input circuit and pushed by said first input circuit, said first current source circuit and said second current source circuit being serial-connected between a first voltage supply terminal and a second voltage supply terminal;
    a first input pair constant current circuit coupled to said first input circuit; and
    a second input pair constant current circuit coupled to said first input circuit.

3. The apparatus of claim 1, wherein said output stage of said operational amplifier is a push-pull output stage serial-connected to between said first voltage supply terminal and said second voltage supply terminal, said push-pull output stage including a first transistor and a second transistor, said first transistor being pushed by said first current source circuit, said second transistor being pushed by said second current source circuit.

4. The apparatus of claim 1, wherein said input stage of said operational amplifier includes:
    a first input circuit, said first input circuit being coupled to a control electrode of a non-inverting input terminal and an inverting input terminal of said operational amplifier;
    a second current source circuit coupled to said first input circuit and pushed by said first input circuit; and
    a first current source circuit, said first current source circuit and said second current source circuit being serial-connected between a first voltage supply terminal and a second voltage supply terminal, said first current source circuit being serial-connected to a constant current circuit.

5. The apparatus of claim 4, wherein said output stage of said operational amplifier is a push-pull output stage serial-connected to between said first voltage supply terminal and said second voltage supply terminal, said push-pull output stage including a first transistor and a second transistor, said first transistor being pushed by said first current source circuit, said second transistor being pushed by said second current source circuit.

6. The apparatus of claim 1, further comprising a monitoring control device between said supplementary output device and said output stage of said operational amplifier, said monitoring control device being controlled by said output stage to generate a pull-up control signal and pull-down control signal to said supplementary output device to control said supplementary output device.

7. The apparatus of claim 6, said monitoring control device includes:
    a pull-up attenuation unit having an input terminal couple to a control gate of said first output transistor to generate said pull-up control signal; and
    a pull-down attenuation unit having an input terminal couple to a control gate of said second output transistor to generate said pull-down control signal.

8. The apparatus of claim 7, wherein said pull-up attenuation unit is a conducting transistor and said pull-down attenuation unit is another conducting transistor.

9. The apparatus of claim 7, wherein said pull-up attenuation unit includes a first transistor and a first constant current source serial-connected together, a gate of said first transistor being coupled to said control gate of said first output transistor; said pull-up attenuation unit includes a second transistor and a second constant current source serial-connected together, a gate of said second transistor being coupled to said control gate of said second output transistor.

10. The apparatus of claim 6, wherein said supplementary output device includes:
    a pull-up output unit receiving said pull-up control signal, an output terminal of said pull-up output unit being coupled to said output terminal of said operational amplifier; and
    a pull-down output unit receiving said pull-down control signal, an output terminal of said pull-down output unit being coupled to said output terminal of said operational amplifier.

11. The apparatus of claim 6, wherein said supplementary input device includes a first sub-current source to receive said pull-up control signal, and an output terminal of said supplementary output device is parallel-connected to said first constant circuit and is serial-connected to said first input circuit.

12. The apparatus of claim 11, wherein said first sub-current source includes a first sub-current source control transistor, a gate of said first sub-current source control transistor being coupled to said pull-up control signal, a source of said first sub-current source control transistor being coupled to a first voltage supply terminal, a drain of said first sub-current source control transistor being coupled to said first input circuit.

13. The apparatus of claim 11, wherein said first sub-current source includes a first sub-current source control transistor and a first sub-constant current source, a gate of said first sub-current source control transistor being coupled to said pull-up control signal, a source of said first sub-current source control transistor being coupled to said first sub-constant current source, a drain of said first sub-current source control transistor being coupled to said first input circuit.

14. The apparatus of claim 11, wherein said first sub-current source includes a current mirror unit, said current mirror unit including a first current mirror and a first current mirror control transistor, a gate of said first current mirror control transistor being coupled to said pull-up control signal, a drain of said first current mirror control transistor being coupled to said first current mirror, a source of said first current mirror control transistor being coupled to a first voltage supply terminal via a first sub-constant current source, said first current mirror being parallel-connected to said first current mirror and serial-connected to said second input circuit.

15. The apparatus of claim 14, wherein said first current mirror includes a first current mirror transistor and a second current mirror transistor, a gate of said first current mirror transistor being coupled to a gate of said second current mirror transistor, and being coupled to a drain of said first current mirror transistor and to a drain of said first current mirror control transistor, a source of said first current mirror transistor and a source of said second current mirror transistor being coupled to a second voltage supply terminal, a drain of said second current mirror transistor being coupled to said second input circuit.

16. The apparatus of claim 11, wherein said first sub-current source includes a current generating unit, said current generating unit including a first current mirror and a first current mirror control transistor, a gate of said first current mirror control transistor being coupled to said pull-up control signal, a drain of said first current mirror control transistor being coupled to said first current mirror, a source of said first current mirror control transistor being coupled to a first voltage supply terminal, said first current mirror being parallel-connected to said first current mirror and serial-connected to said second input circuit.

17. The apparatus of claim 16, wherein said first current mirror includes a first current mirror transistor and a second current mirror transistor, a gate of said first current mirror transistor being coupled to a gate of said second current mirror transistor, and being coupled to a drain of said first current mirror transistor and to a drain of said first current mirror control transistor, a source of said first current mirror transistor and a source of said second current mirror transistor being coupled to a second voltage supply terminal, a drain of said second current mirror transistor being coupled to said second input circuit.

18. The apparatus of claim 11, wherein said supplementary input device includes a second sub-current source to receive said pull-down control signal, and an output terminal of said supplementary output device is parallel-connected to said second constant circuit and is serial-connected to said second input circuit.

19. The apparatus of claim 18, wherein said second sub-current source includes a second sub-current source control transistor, a gate of said second sub-current source control transistor being coupled to said pull-down control signal, a source of said second sub-current source control transistor being coupled to a second voltage supply terminal, a drain of said second sub-current source control transistor being coupled to said second input circuit.

20. The apparatus of claim 18, wherein said second sub-current source includes a second sub-current source control transistor and a second sub-constant current source, a gate of said second sub-current source control transistor being coupled to said pull-down control signal, a source of said second sub-current source control transistor being coupled to said second sub-constant current source, a drain of said second sub-current source control transistor being coupled to said second input circuit.

21. The apparatus of claim 18, wherein said second sub-current source includes a second current mirror unit, said second current mirror unit including a second current mirror and a second current mirror control transistor, a gate of said second current mirror control transistor being coupled to said pull-down control signal, a drain of said second current mirror control transistor being coupled to said second current mirror, a source of said second current mirror control transistor being coupled to a second voltage supply terminal via a second sub-constant current source, said second current mirror being parallel-connected to said second current mirror and serial-connected to said first input circuit.

22. The apparatus of claim 21, wherein said second current mirror includes a third current mirror transistor and a fourth current mirror transistor, a gate of said third current mirror transistor being coupled to a gate of said fourth current mirror transistor, and being coupled to a drain of said third current mirror transistor and to a drain of said second current mirror control transistor, a source of said third current mirror transistor and a source of said fourth current mirror transistor being coupled to a first voltage supply terminal, a drain of said fourth current mirror transistor being coupled to said first input circuit.

23. The apparatus of claim 18, wherein said second sub-current source includes a second current mirror unit, said second current mirror unit including a second current mirror and a second current mirror control transistor, a gate of said second current mirror control transistor being coupled to said pull-down control signal, a drain of said second current mirror control transistor being coupled to said second current mirror, a source of said second current mirror control transistor being coupled to a second voltage supply terminal, said second current mirror being parallel-connected to said second current mirror and serial-connected to said first input circuit.

24. The apparatus of claim 23, wherein said second current mirror includes a third current mirror transistor and a fourth current mirror transistor, a gate of said third current mirror transistor being coupled to a gate of said fourth current mirror transistor, and being coupled to a drain of said third current mirror transistor and to a drain of said second current mirror control transistor, a source of said third current mirror transistor and a source of said fourth current mirror transistor being coupled to a first voltage supply terminal, a drain of said fourth current mirror transistor being coupled to said first input circuit.

25. A method for increasing a slew rate of an operational amplifier, said operational amplifier including an input stage and an output stage, said input stage receiving an input signal, said operational amplifier amplifying said input signal, said output stage outputting an output signal via an output terminal, said output signal being said amplified input signal, said method comprising:

using a gate driving voltage of said output stage to provide a supplementary output current to said output terminal and to provide a supplementary input current to said input stage in order to increase said slew rate of said operational amplifier.

26. The method of claim 25, wherein when a voltage level of said output signal is not substantially equal to a voltage level of said input signal, said output stage controls a supplementary output device to provide said output stage with said supplementary output current and controls a supplementary input device to provide said input stage with said supplementary input current; when said voltage level of said output signal is substantially equal to said voltage level of said input signal, said supplementary input device and said supplementary output device stops outputting said supplementary input current to said input stage and said supplementary output current to said output stage.

27. The method of claim 25, wherein said step of using a gate driving voltage of said output stage to provide said supplementary output current to said output terminal and to provide said supplementary input current to said input stage includes:

attenuating a gate voltage of said output stage; and
a supplementary output stage based on said attenuated gate voltage generating said supplementary output current to said output stage and a supplementary input stage based on said attenuated gate voltage generating said supplementary input current to said input stage.

28. The method of claim 27, wherein said step of attenuating said gate voltage of said output stage includes serial connecting a voltage source to said gate voltage of said output stage.

29. The method of claim 27, wherein said step of attenuating said gate voltage of said output stage includes using a voltage level shift procedure.

30. The method of claim 27, wherein said step of said supplementary input stage based on said attenuated gate voltage generating said supplementary input current to said input stage includes adding an input pair current to said input stage, said input pair current being controlled by said gate voltage of said output stage to accelerate increasing and decreasing said gate voltage of said output stage.

31. The method of claim 30, wherein said step of adding said input pair current to said input stage includes a constant current source providing a constant current to accelerate increasing and decreasing said gate voltage of said output stage.

32. The method of claim 27, wherein said step of said supplementary input stage based on said attenuated gate voltage generating said supplementary input current to said input stage includes adding a current mirror stage to said input stage, said current mirror stage being controlled by said gate voltage of said output stage providing a current to said input stage to accelerate increasing and decreasing said gate voltage of said output stage.

33. The method of claim 32, wherein said current mirror stage includes a constant current source providing a constant current to accelerate increasing and decreasing said gate voltage of said output stage.

* * * * *